(12) United States Patent
Noda

(10) Patent No.: US 6,919,589 B2
(45) Date of Patent: Jul. 19, 2005

(54) HEMT WITH A GRADED INGAALP LAYER SEPARATING OHMIC AND SCHOTTKY CONTACTS

(75) Inventor: Takao Noda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/737,864

(22) Filed: Dec. 18, 2003

(65) Prior Publication Data
US 2004/0169194 A1 Sep. 2, 2004

(30) Foreign Application Priority Data
Dec. 19, 2002 (JP) ........................................ 2002-367573

(51) Int. Cl.$^7$ ...................... H01L 29/80; H01L 31/0328
(52) U.S. Cl. ...................... 257/190; 257/192; 257/194
(58) Field of Search ............................... 257/190, 192, 257/194, 195, 200, 201

(56) References Cited

U.S. PATENT DOCUMENTS 5,319,223 A    6/1994  Fujita et al. ............... 257/192
5,811,843 A  * 9/1998  Yamamoto et al. ......... 257/194

FOREIGN PATENT DOCUMENTS

JP           3086748       9/2000

OTHER PUBLICATIONS

S. Bollaert, et al., IEEE Electron Device Letters, vol. 20, No. 3, pp. 123–125, "METAMORPHIC $In_{0.4}Al_{0.6}As/In_{0.4}Ga_{0.6}As$ HEMT's on GaAs SUBSTRATE", Mar. 1999.

* cited by examiner

Primary Examiner—Minhloan Tran
Assistant Examiner—Thomas L. Dickey
(74) Attorney, Agent, or Firm—Oblon, Spivak, McClelland, Maier & Neustadt, P.C.

(57) ABSTRACT

A semiconductor device comprises: a GaAs substrate; a buffer layer provided on the GaAs substrate; a laminated structure provided on the buffer layer; a Schottky contact layer provided on the laminated structure; a n-type $In_x(Ga_{1-y}Al_y)_{1-x}P$ layer provided on the Schottky contact layer; a n-type $In_{u2}Ga_{1-u2}As$ ohmic contact layer provided on the n-type $In_x(Ga_{1-y}Al_y)_{1-x}P$ layer; a gate electrode provided on the Schottky contact layer; and a source electrode and a drain electrode provided on the ohmic contact layer. The buffer layer is made of a semiconductor, and at least a part of the semiconductor has a lattice constant larger than a lattice constant of GaAs. The channel layer is made of $In_{u1}Ga_{1-u1}As$, and the electron supply layer is made of n-type $In_{v1}Al_{1-v1}As$. At least a part of the Schottky contact layer is made of non-doped $In_{v2}Al_{1-v2}As$. The $In_x(Ga_{1-y}Al_y)_{1-x}P$ layer has a part where a bandgap has a distribution which shows a gradual or a stepwise decrease from the Schottky contact layer toward the ohmic contact layer.

11 Claims, 5 Drawing Sheets

FIG.7

HEMT WITH A GRADED INGAALP LAYER SEPARATING OHMIC AND SCHOTTKY CONTACTS

CROSS-REFERENCE TO RELATED APPLICATIONS

This application is based upon and claims the benefit of priority from the prior Japanese Patent Application No. 2002-367573, filed on Dec. 19, 2002; the entire contents of which are incorporated herein by reference.

BACKGROUND OF THE INVENTION

The present invention relates to a semiconductor device, and more particularly, it relates to a semiconductor device having a field effect transistor using two-dimensional electron gas.

The "high-electron mobility transistor (HEMT)" is known as one kind of a field effect transistor (FET). The high-electron mobility transistor is a transistor in which, for example, a heterojunction between a channel layer consisting of a high purity semiconductor and an electron supply layer whose electron affinity is smaller than that of the channel layer and in which n-type impurities are doped in high concentration is formed on a semi-insulating semiconductor substrate, and the 2-dimensional electron gas (2DEG) which is built up in the channel layer and has a high mobility of the electron is used as a carrier.

Currently, most general HEMT is Pseudomorphic-HEMT (P-HEMT) in which a gallium arsenide (GaAs) is used as the substrate and an indium gallium arsenide (InGaAs) which does not have a lattice conformity to GaAs is used as the channel layer. $In_xGa_{1-x}As$ which is the material of the channel layer has the advantage that the electron mobility becomes higher, the frequency becomes higher and a noise becomes lower as the indium composition x increases.

However, in P-HEMT, channel layers whose indium compositions x were less than 0.25 have only been used since it was necessary to make the thickness of the channel layer less than a critical thickness (thickness at which a crystalline lattice can maintain its elastic deformation).

On the other hand, in the case of HEMT (InP-HEMT) using the indium phosphorus (InP) as the substrate, an excellent performance of high frequency is obtained since In0.53Ga0.47As has a lattice conformity to InP can be used as the material of the channel layer. However, there are problems that (1) InP substrate is more expensive than GaAs substrate and (2) when the indium composition is 0.53, an energy band gap Eg becomes small and the breakdown voltage to an electric field becomes low.

In recent years, HEMT (Metamorphic-HEMT (MM-HEMT)) in which a semiconductor layer which has a larger lattice constant than GaAs is formed firstly on a GaAs substrate as a buffer layer, and thus, a hetero structure where the InxGa1-xAs layer whose indium composition x is more than 0.3 acts as the channel layer is laminated, has become able to be manufactured by advanced crystal growth technologies, such as a molecular beam epitaxy (MBE) method and a metal organic chemical vapor deposition (MOCVD) method.

MM-HEMT has the advantage of not only being excellent in its high frequency performance since the indium composition of the channel layer can be made larger than that of P-HEMT, but also being less expensive to manufacture than InP-HEMT for the less expensive GaAs substrate.

Figure 7:
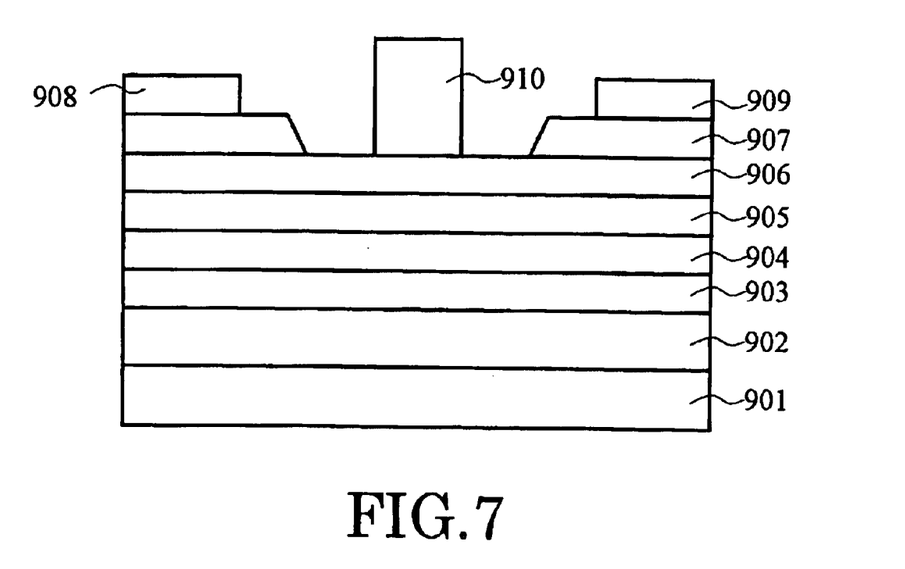
FIG. 7 is a schematic diagram showing an example of the cross-sectional structure of MM-HEMT which was examined by the Inventor of the present invention in the course of attaining this invention.

FIG. 7 is a schematic diagram showing an example of the cross-sectional structure of MM-HEMT which was examined by the Inventor of the present invention in the course of attaining this invention. This structure will be explained as follows along with the manufacturing process.

First, a non-doped $In_vAl_{1-v}As$ buffer layer 902 whose indium composition v is changed gradually from 0 to 0.39, a non-doped $In_{0.40}Ga_{0.6}As$ channel layer 903, a non-doped $In_{0.39}Al_{0.61}As$ spacer layer 904, a Si-doped n-type $In_{0.39}Al_{0.61}As$ electron supply layer 905, a non-doped $In_{0.39}Al_{0.61}As$ Schottky contact layer 906 and a Si-doped n-type $In_{0.40}Ga_{0.60}As$ ohmic contact layer 907 are formed on a semi-insulating GaAs substrate 901 in this order by the MOCVD method.

Next, a source electrode 908 and a drain electrode 909 by a non alloy type ohmic contact in which Titanium (Ti), platinum (Pt) and gold (Au) are laminated in this order are formed by a photolithography and a vapor deposition process.

Next, the n-type InGaAs ohmic contact layer 907 which have only one part exposed by electron beam exposure is etched and removed, and the surface of the non-doped InAlAs Schottky contact layer 906 is exposed. Then, the Ti/Pt/Au gate electrode 910 is formed on it, and the principal part of HEMT is completed.

Although the case that indium composition of the channel layer 903 is 0.4 was explained above in the example, MM-HEMT can be made by the same manufacturing method also in the case of other indium compositions.

Thus, MM-HEMT has an advantage that indium composition of the channel layer is not restrained by the lattice conformity conditions to the substrate. Furthermore, MM-HEMT whose indium composition is in a range between 0.31 and 0.45 has the following advantages:

(1) The band discontinuous quantity ΔEc between the conduction bands of the InAlAs electron supply layer 905 and the InGaAs channel layer 903 is 0.62–0.80 eV, and is larger than 0.34 eV of P-HEMT and 0.52 eV of InP-HEMT. Therefore, high 2DEG concentration is obtained.

(2) Since the band gap Eg of the channel layer 903 is 0.84–1.00 eV and is larger than that of InP-HEMT which is 0.76 eV, a high breakdown voltage is obtained.

However, MM-HEMT whose indium composition is in a range between 0.31 and 0.45 has the following problems:

That is, the band discontinuous quantity ΔEc of the conduction bands at the hetero interface between the n-type InGaAs ohmic contact layer 907 and the non-doped InAlAs Schottky contact layer 906 is 0.62 through 0.80 eV. In contrast, the band discontinuous quantity ΔEc between the GaAs ohmic contact layer of P-HEMT and an AlGaAs electron supply layer is 0.15 eV.

Moreover, the band discontinuous quantity ΔEc between the InGaAs ohmic contact layer of InP-HEMT and an InAlAs Schottky contact layer is 0.52 eV. That is, the band discontinuous quantity of the conduction bands at the hetero interface between the ohmic contact layer 907 and the Schottky contact layer 906 of MM-HEMT is larger than that of P-HEMT and InP-HEMT by 0.1 eV or more.

The band discontinuity of the conduction bands serves as a barrier for the electron current among the source electrode 908, the drain electrode 909 and the InGaAs channel layer 903 by non-alloy ohmic contact. Therefore, the band discontinuity of this conduction band becomes the cause of increasing source resistance and drain resistance remarkably. Consequently, there was a problem that the high frequency performance and low noise performance of the element were degraded.

As explained above, there was a problem that high frequency performance and low noise performance were degraded because the band discontinuous quantity ΔEc between the conduction bands of the n-type InGaAs ohmic contact layer 907 and the non-doped InAlAs Schottky contact layer 906 was large in MM-HEMT expressed in FIG. 7.

SUMMARY OF THE INVENTION

According to an aspect of the invention, there is provided a semiconductor device comprising: a GaAs substrate; a buffer layer provided on the GaAs substrate, the buffer layer being made of a semiconductor, and at least a part of the semiconductor having a lattice constant larger than a lattice constant of GaAs; a channel layer provided on the buffer layer, and being made of $In_{u1}Ga_{1-u1}As$; an electron supply layer provided on or under the channel layer, and being made of n-type $In_{v1}Al_{1-v1}As$; a Schottky contact layer provided on the channel layer and the electron supply layer, at least a part of the Schottky contact layer being made of non-doped $In_{v2}Al_{1-v2}As$; a n-type $In_x(Ga_{1-y}Al_y)_{1-x}P$ layer provided on the Schottky contact layer; a n-type $In_{u2}Ga_{1-u2}As$ ohmic contact layer provided on the n-type $In_x(Ga_{1-y}Al_y)_{1-x}P$ layer; a gate electrode provided on the Schottky contact layer; and a source electrode and a drain electrode provided on the ohmic contact layer.

According to other aspect of the invention, there is provided a semiconductor device comprising: a GaAs substrate; a buffer layer provided on the GaAs substrate, the buffer layer being made of a semiconductor, and at least a part of the semiconductor having a lattice constant larger than a lattice constant of GaAs; a laminated structure provided on the buffer layer, including a channel layer and a electron supply layer, the channel layer being made of $In_{u1}Ga_{1-u1}As$, and the electron supply layer being made of n-type $In_{v1}Al_{1-v1}As$; a Schottky contact layer provided on the laminated structure, at least a part of the Schottky contact layer being made of non-doped $In_{v2}Al_{1-v2}As$; a n-type $In_x(Ga_{1-y}Al_y)_{1-x}P$ layer provided on the Schottky contact layer; a n-type $In_{u2}Ga_{1-u2}As$ ohmic contact layer provided on the n-type $In_x(Ga_{1-y}Al_y)_{1-x}P$ layer; a gate electrode provided on the Schottky contact layer; and a source electrode and a drain electrode provided on the ohmic contact layer, the $In_x(Ga_{1-y}Al_y)_{1-x}P$ layer having a part where a bandgap has a distribution which shows a gradual or a stepwise decrease from the Schottky contact layer toward the ohmic contact layer.

According to other aspect of the invention, there is provided a semiconductor device comprising: a GaAs substrate; a buffer layer provided on the GaAs substrate, the buffer layer being made of a semiconductor, and at least a part of the semiconductor having a lattice constant larger than a lattice constant of GaAs; a laminated structure provided on the buffer layer, including a channel layer and a electron supply layer, the channel layer being made of $In_{u1}Ga_{1-u1}As$, and the electron supply layer being made of n-type $In_{v1}Al_{1-v1}As$; a Schottky contact layer provided on the laminated structure, at least a part of the Schottky contact layer being made of non-doped $In_{v2}Al_{1-v2}As$; a n-type $In_x(Ga_{1-y}Al_y)_{1-x}P$ layer provided on the Schottky contact layer; a n-type $In_{u2}Ga_{1-u2}As$ ohmic contact layer provided on the n-type $In_x(Ga_{1-y}Al_y)_{1-x}P$ layer; a gate electrode provided on the Schottky contact layer; and a source electrode and a drain electrode provided on the ohmic contact layer, the buffer layer having a part where the lattice constant has a distribution which shows a gradual or a stepwise increase from the substrate toward the laminated structure, and the $In_x(Ga_{1-y}Al_y)_{1-x}P$ layer having a part where a bandgap has a distribution which shows a gradual or a stepwise decrease from the Schottky contact layer toward the ohmic contact layer.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

Figure 1:
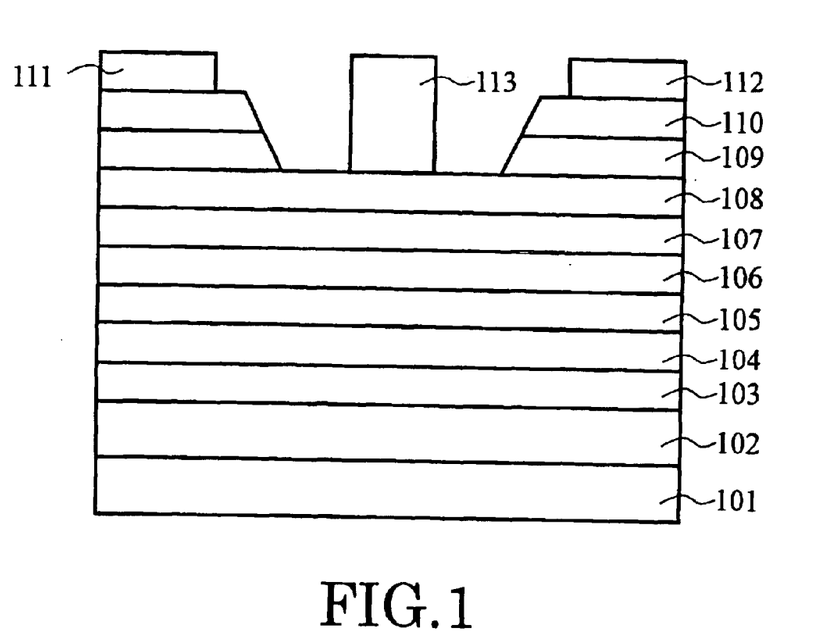
FIG. 1 is a schematic diagram which illustrates the cross-sectional structure of the semiconductor device according to the embodiment of the invention.

FIG. 1 is a schematic diagram which illustrates the cross-sectional structure of the semiconductor device according to the embodiment of the invention. That is, this is MM-HEMT formed on the semi-insulating GaAs substrate 101.

This semiconductor device has a structure where the non-doped $In_vAl_{1-v}As$ buffer layer 102 whose indium composition v is changed gradually, the Si-doped n-type InAlAs electron supply layer 103, the non-doped InAlAs spacer layer 104, the non-doped InGaAs channel layer 105 and the non-doped InAlAs spacer layer 106, the Si-doped n-type InAlAs electron supply layer 107, the non-doped InAlAs Schottky contact layer 108, the Si-doped n-type InGaAlP layer 109, and the Si-doped n-type InGaAs ohmic contact layer 110 are laminated in this order on the GaAs substrate 101.

And the source electrode 111 and the drain electrode 112 are formed on the ohmic contact layer 110, respectively. Moreover, the ohmic contact layer 110 and the n-type InGaAlP layer 109 between these electrodes are removed, and the gate electrode 113 is formed on the Schottky contact layer 108.

In this HEMT, the electrons supplied from the electron supply layers 103 and 107 form 2DEG in the channel layer 105, and switching operation can be carried out in high-speed in response to the bias application to the gate electrode 113.

The thickness of the Schottky contact layer 108 may be about 20 nm. If the Schottky contact layer is too thick, the layer may not be fully depleted. If the Schottky contact layer is too thin, a current leakage may occur.

As will be explained in more detail later, the Schottky contact layer 108 may have a laminated structure including an InAlAs layer and an AlGaAs layer, or including an InAlAs layer, InGaP layer and an InAlAs layer.

As a material of the buffer layer 102, InGaAs, InGaAlAs, InGaP, InAlP, or InGaAlP can be used besides InAlAs. Moreover, the buffer layer may be a single layer formed of one of these materials, or it may also be a multilayer laminated by a plurality of these materials.

And in order to ease "mismatch" of the lattice constant of the GaAs substrate 101 from the semiconductor layer which is grown on the GaAs substrate 101, it is desirable to make the buffer layer 102 to have a distribution so that the lattice constant thereof shows a gradual increase or a stepwise increase with distance from the substrate 101 along the thickness direction. The lattice constant may just be increasing with distance from the substrate 101 along the thickness direction in the whole of the buffer layer 102. There can be a local region where the lattice constant decreases with distance from the substrate 101 along the layer thickness direction in the buffer layer 102. For example, when the buffer layer 102 has a laminated structure of the InAlAs layer and the InGaP layer, the lattice constant may be decreasing locally with distance from the substrate 101 in these junction regions.

On the other hand, in order to keep the lattice conformity to the buffer layer 102, it is desirable to make the indium composition U of $In_UGa_{1-U}As$ which constitutes the channel layer 105 and the ohmic contact layer 110 is in a range of $0.31 \leq U \leq 0.45$. The indium composition of the channel layer 105 and the ohmic contact layer 110 may be the same, or may also be different from each other.

However, when the thicknesses of the channel layer 105 and the ohmic contact layer 110 are thinner than the "critical thickness", the misfit dislocations etc. can be prevented, as will be explained later, even if they do not have the lattice conformity to the top layer of the buffer layer 102. Therefore, it becomes possible to raise the maximum of the indium composition U to about 0.6, when the thicknesses of these layers are thinner than the critical thickness.

In addition, about the channel layer 105, it is desirable to make the indium composition U less than 0.45 in order to obtain a breakdown voltage higher than that of so-called InP-HEMT.

If the indium composition of InGaAs which constitutes the channel layer 105 is made in the range between 0.31 and 0.45, the band gap Eg of the channel layer 105 will be 0.84–1.00 eV and be larger than 0.76 eV of InP-HEMT, and a high breakdown voltage will be obtained.

And, it is desirable to make indium compositions V of $In_VAl_{1-V}As$ which constitute the electron supply layers 103 and 107 and the Schottky contact layer 108 in $0.30 \leq V \leq 0.44$ in order to keep the lattice conformity to the buffer layer 102. The indium compositions of the electron supply layers 103, 107 and the Schottky contact layer 108 may be the same, or may also be different.

However, when the thicknesses of the electron supply layer 103 and the Schottky contact layer 108 are thinner than the "critical thickness", the misfit dislocation etc. can be prevented, as will be explained later, even if they do not have the lattice conformity to the top layer of the buffer layer 102. Therefore, when the thicknesses of these layers are thinner than the critical thickness, it becomes possible to lower the minimum of the indium composition V to about 0.1.

If the indium compositions of the channel layer 105 and the electron supply layers 103 and 107 are made within the above-mentioned range, the band discontinuous quantity ΔEc between the conduction bands of the electron supply layers 103 and 107 and the channel layer 105 is 0.62–0.80 eV and is larger than 0.34 eV of P-HEMT and 0.52 eV of InP-HEMT. Therefore, high 2DEG concentration will be obtained.

On the other hand, since HEMT of this embodiment can be manufactured with the GaAs substrate by being provided the buffer layer 102 which has the gradient of the composition, it also has the advantage that manufacturing cost becomes less expensive.

And HEMT of this embodiment has further characteristic that the n-type InGaAlP layer 109 is inserted between the InAlAs Schottky contact layer 108 and the InGaAs ohmic contact layer 110. This makes the band discontinuity between the Schottky contact layer 108 and the ohmic contact layer 110 be eased. As the result, the source resistance and the drain resistance are lowered and the high frequency performance and the noise performance of the transistor can be improved.

It is desirable for the indium composition X of this $In_X(Ga_{1-Y}Al_Y)_{1-X}P$ layer 109 to be in a range $0.78 \leq X \leq 0.92$ and for the aluminum composition Y to be in a range $0 \leq Y \leq 1$ in order to keep the lattice conformity to the buffer layer 102.

However, when the thickness of the InGaAlP layer 109 is thinner than the "critical thickness", the misfit dislocation etc. can be prevented, as will be explained later, even if they do not have the lattice conformity with the top layer of the buffer layer 102. Therefore, when the thickness of the InGaAlP layer 109 is thinner than the critical thickness, it becomes possible to raise the maximum of the indium composition X to 1.

Furthermore, the energy band discontinuous quantity can also be made smaller by changing continuously or intermittently at least either of the indium composition of the n-type InGaAlP layer 109 or the aluminum composition from the Schottky contact layer 108 toward the ohmic contact layer 110.

Meanwhile, a HEMT in which InAlAs is used as the electron supply layer, InGaAlP is used as a Schottky contact layer and the gate electrode is formed on InGaAlP is disclosed in Japanese Patent Publication No. 3086748 and the U.S. Pat. No. 5,319,223 for Fujita et. al. In this case, however, if the indium composition of the InGaAlP layer is made smaller in the ohmic contact layer side and a gate electrode is formed on the InGaAlP layer in order to reduce ΔEc between the InGaAs ohmic contact layer and the InGaAlP layer to the level in which the source resistance and the drain resistance do not increase remarkably, the gate leak current will become remarkably large and the performance of the element will be degraded.

Therefore, in order to reduce the source resistance and the drain resistance, and to make the gate leak current low enough, it is important to form the gate electrode on the InAlAs Schottky contact layer exposed to the surface after etching and removing a part of the InGaAlP layer.

Figure 2A:
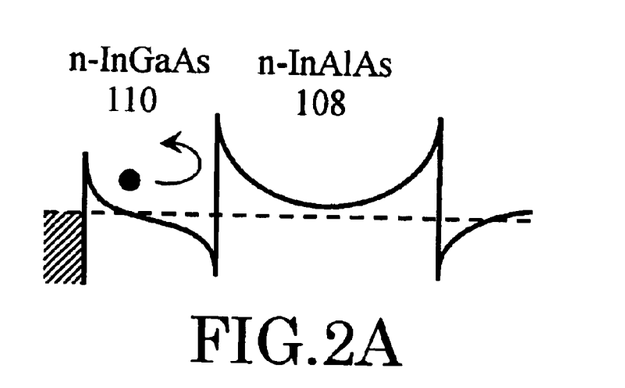
FIG. 2A through FIG. 2C are schematic diagrams which express the energy band structures of the conduction band of HEMT of this embodiment with a comparative example.
Figure 2B:
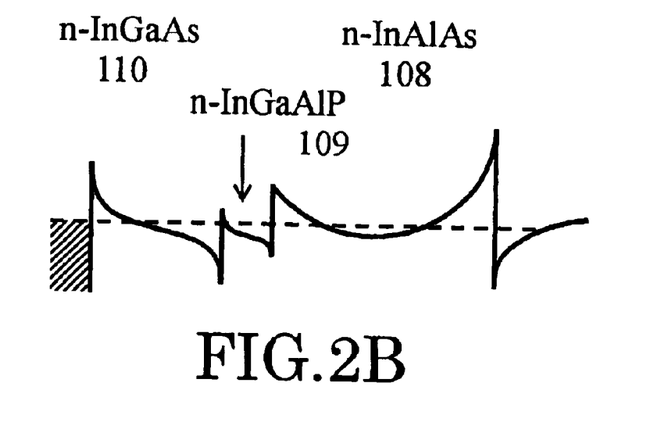
Figure 2C:
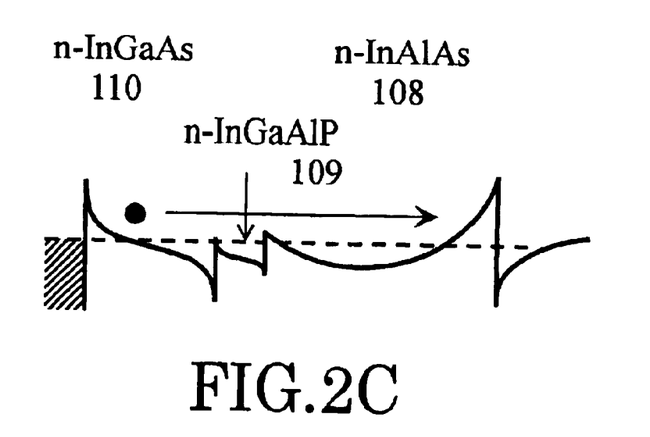

FIG. 2A through FIG. 2C are schematic diagrams which express the energy band structures of the conduction band of HEMT of this embodiment along with a comparative example. That is, FIG. 2A expresses the energy band structure under the ohmic electrode of MM-HEMT in which the InGaAlP layer 109 is not provided. And FIG. 2B and FIG. 2C express the energy band structures of MM-HEMT in which the InGaAlP layer 109 is inserted between the InGaAs ohmic contact layer 110 and the InAlAs Schottky contact layer 108 of this embodiment.

In MM-HEMT in which the InGaAlP layer 109 is not provided, the source resistance and the drain resistance become high since the large band discontinuity arises between the InGaAs ohmic contact layer 110 and the InAlAs Schottky contact layer 108 and becomes a barrier over electron current, as expressed in FIG. 2.

In contrast, in MM-HEMT in which the InGaAlP layer 109 is provided, the band discontinuity of the conduction band can be decreased and the barrier over electron current can be reduced, as expressed in FIG. 2B.

Furthermore, when the aluminum composition of the InGaAlP layer 109 is reduced continuously or gradually from the InAlAs Schottky contact layer 108 to the InGaAs ohmic contact layer 110, the band discontinuity of the conduction band will be reduced further, as expressed in FIG. 2C. The same effect as the above is acquired, even if the indium composition of the InGaAlP layer 109 is increased toward the ohmic contact layer 110 from the Schottky contact layer 108 continuously or gradually.

Thus, the barrier over the electron current formed by the band discontinuity between the conduction bands at heterojunction from the source electrode 111 and the drain electrode 112 to the channel layer 105 can be reduced by inserting the InGaAlP layer 109. Especially, there is the gradient of the aluminum composition, the barrier of $\Delta E_c$ becomes the minimum, and the resistance reduction effect can be acquired more notably. Moreover, the indium composition may have the gradient instead of the aluminum composition in this case, or both of these compositions may be have the gradients simultaneously.

Next, the lattice conformity conditions in HEMT of this embodiment will be explained.

Figure 3:
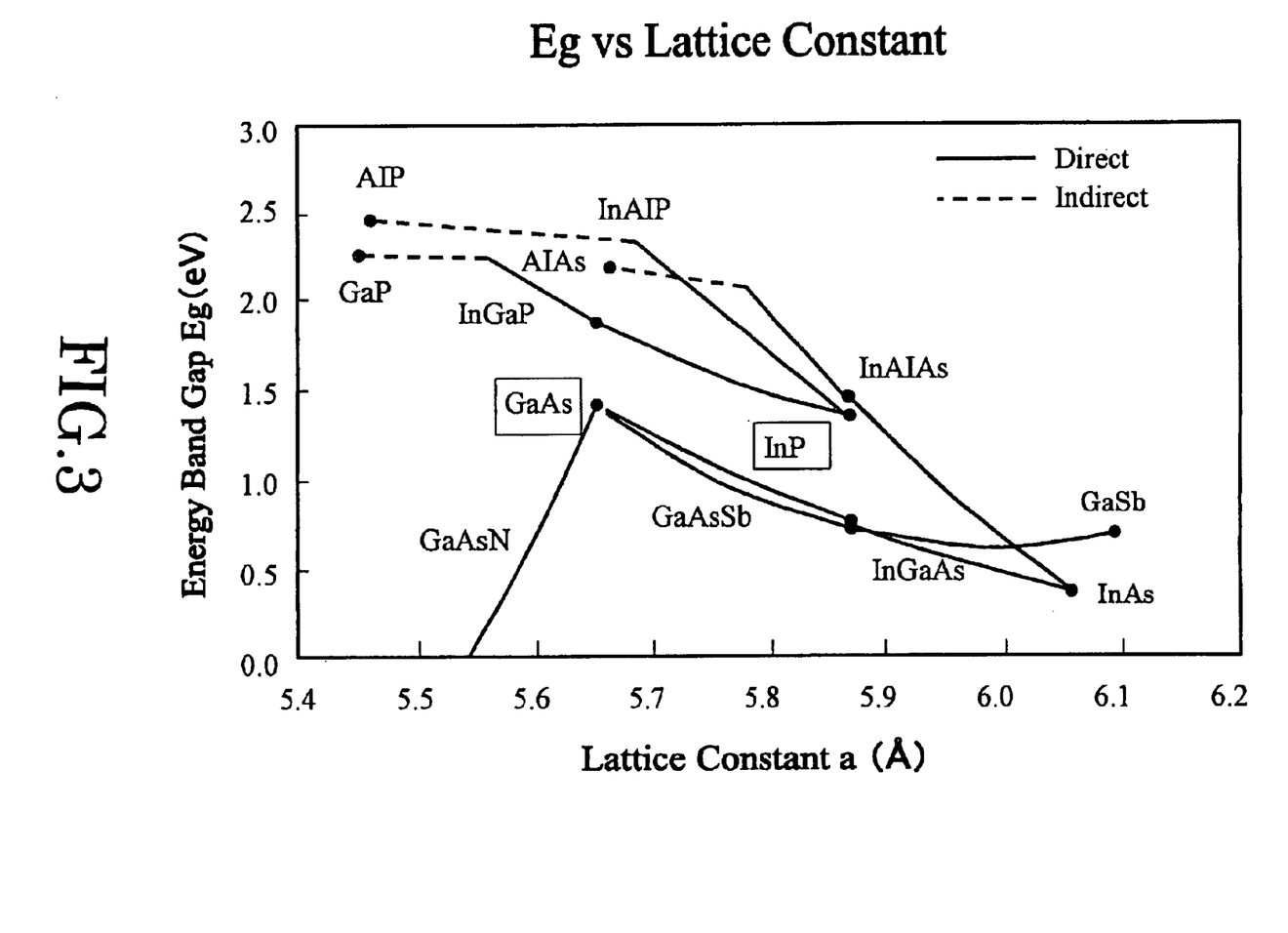
FIG. 3 is a graphical representation showing the relation between the lattice constant of compound semiconductor of an III–V family, and the energy band gap.

FIG. 3 is a graphical representation showing the relation between the lattice constant of compound semiconductor of an III–V family, and the energy band gap.

In order to raise the stability of the wafer quality at the time of the crystal growth, as for the InGaAs layer, the InAlAs layer, and the InGaAlP layer which are used for HEMT, it is desirable to keep a lattice conformity to the top of the buffer layer 102 (whose composition may have the gradient in the thickness direction).

Supposing the compositions of the channel layer 105 and the ohmic contact layer 110 are $In_U Ga_{1-U} As$, the compositions of the electron supply layers 103 and 107 and the Schottky contact layer 108 are $In_x Al_{1-x} As$, and the composition of the InGaAlP layer 109 is $In_x(Ga_{1-y}Al_y)_{1-x}P$ the lattice conformitys between each layer are aquired when V=U−0.01 and X=U+0.47. Since the lattice conformity conditions hardly change even if the Al composition Y of the InGaAlP layer 109 changes, Al composition can take the value of $0 \leq Y \leq 1$.

The value of the electron affinity of InGaAlP is between the value of that of InGaAs and the value of the InAlAs under the lattice conformity condition. That is, the band discontinuity can be eased, while maintaining the lattice conformity to the layer of the upper and lower sides, by inserting the InGaAlP layer 109 according to this embodiment.

In addition, it is desirable for the InGaAs layer, the InAlAs layer, and the InGaAlP layer, to carry out lattice conformity to the top layer of the buffer layer 102. However, if the thicknesses of the InGaAs layer, the InAlAs layer, and the InGaAlP layer are less than the critical thickness, the InGaAs layer, the InAlAs layer, and the InGaAlP layer do not necessarily have to carry out the lattice conformity precisely to the top layer of the buffer layer, and do not have to carry out the lattice conformity mutually.

For example, in order to raise high frequency performance, it is also possible to make the indium composition of the InGaAs channel layer 105 high. That is, when the thickness of the channel layer 105 is less than the critical thickness, the indium composition can be made high to the composition in which the channel layer 105 will not carry out the lattice conformity to the top layer of the buffer layer 102.

It is possible to specifically enlarge an indium composition of the channel layer 105 to a about $(X_{In}+0.15)$ from the indium composition $X_{In}$ of InGaAs which has a lattice conformity to the top layer of the buffer layer 102, when the thickness of the channel layer 105 or the ohmic contact layer 110 is about 20 nm or less.

Moreover, it is possible to make indium composition of the electron supply layer 103 or the Schottky contact layer 108 small to a about $(X_{In}-0.2)$ from the indium composition $X_{In}$ of InAlAs which has a lattice conformity to the top layer of the buffer layer 102, when the thickness of the electron supply layer 103 or the Schottky contact layer 108 is about 15 nm or less.

Moreover, it is also possible to enlarge indium composition of the InGaAlP layer 109 to a about $(X_{In}+0.2)$ to the indium composition $X_{In}$ of InGaAlP which has a lattice conformity to the top layer of the buffer layer 102, when the thickness of the InGaAlP layer 109 is about 15 nm or less.

Moreover, if it is below critical thickness, in order to raise a breakdown voltage, the indium composition of the InAlAs Schottky contact layer 108 can also be shifted from lattice conformity conditions by making the indium composition smaller. Or in order to make still smaller conduction band discontinuity of the heterojunction from the source electrode 111 and the drain electrode 112 to the channel layer 105, indium composition of the InGaAlP layer 109 can be enlarged gradually to be shifted from the lattice conformity condition. That is, when the thickness is smaller than the critical thickness, it is also possible to shift the composition from a lattice conformity condition in order to realize the desired performance.

As explained above, in the case of MM-HEMT of this embodiment, it is possible to reduce the band discontinuous quantity of the conduction band at the heterojunction between the ohmic contact layer 110 and the Schottky contact layer 108, to ease the barrier over electron current and to improve the high frequency characteristic and the low noise characteristic by inserting the n-type InGaAlP layer 109 between the n-type InGaAs ohmic contact layer 110 and the InAlAs Schottky contact layer 108.

Referring to drawings, some embodiments of the present invention will now be described in detail further.

FIRST EXAMPLE

First, MM-HEMT expressed in FIG. 1 was manufactured as the first example of the invention. The manufacturing process is as the following:

First, the non-doped InAlAs buffer layer 102 whose indium composition was gradually changed from 0 to 0.39 was formed on the semi-insulating GaAs substrate 101 by the MOCVD method.

And, the Si-doped n-type InAlAs electron supply layer 103, the non-doped InAlAs spacer layer 104, the non-doped InGaAs channel layer 105, the non-doped InAlAs spacer layer 106, the Si-doped n-type InAlAs electron supply layer 107, the non-doped InAlAs Schottky contact layer 108, and the Si-doped n-type $In_{0.87}(Ga_{1-y}Al_y)_{0.13}P$ layer 109 and the Si-doped n-type $In_{0.4}Ga_{0.6}As$ ohmic contact layer 110 were formed on the non-doped InAlAs buffer layer 102 in this order.

Here, the aluminum composition Y of the In0.87(Gal-yAly) 0.13P layer 109 was changed continuously from 0.5 to 0. The thickness of the InAlAs Schottky contact layer 108 was made to be 20 nm.

Next, the source electrode 111 and the drain electrode 112 by the Ti/Pt/Au non alloy type ohmic contact were formed by the photolithography and the vapor deposition process.

Then, the selection wet etching removal of the n-type InGaAs ohmic contact layer 110 for which only the part was exposed by electron beam exposure was carried out with the phosphoric acid system etching solution. Furthermore, the wet etching removal of the n-type InGaAlP layer 109 was carried out with the chloride system etching solution.

Then, the surface of the non-doped InAlAs Schottky contact layer 108 was exposed. And the Ti/Pt/Au gate electrode 113 was formed.

Moreover, as a comparative example, MM-HEMT in which the InGaAlP layer 109 was not provided as shown in FIG. 7 was manufactured.

Thus, as for the electrical property of MM-HEMT of this example and the comparative example, both of the source resistance $R_s$ and the drain resistance Rd of MM-HEMT of this example have been reduced by about 30% compared with MM-HEMT of the comparative example. Both of the mutual conductance gm and the current gain cutoff frequency $f_T$ became higher by 1%, owing to the fall of $R_s$ and Rd. Moreover, the minimum noise figure $NF_{min}$ was reduced by about 0.1 dB.

SECOND EXAMPLE

Next, HEMT in which the InGaP layer which does not include aluminum was inserted as the second example of the invention was manufactured.

Figure 4:
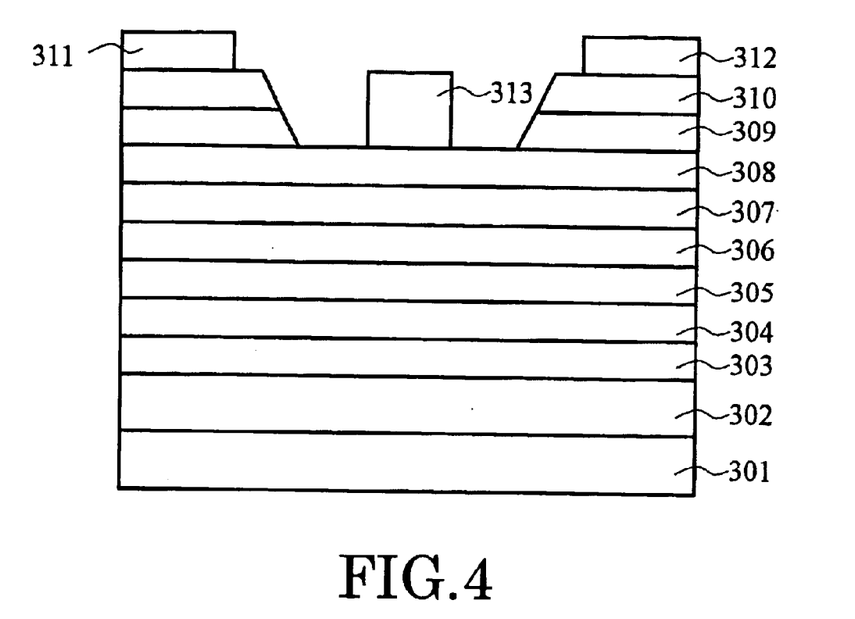
FIG. 4 is a schematic diagram showing the cross-sectional structure of MM-HEMT of the second example of the invention.

FIG. 4 is a schematic diagram showing the cross-sectional structure of MM-HEMT of this example. Hereafter, the structure of this HEMT will be explained along with the manufacturing process.

First, the non-doped $In_YAl_{1-Y}As$ buffer layer 302 whose indium composition was gradually changed from 0 to 0.39 was formed on the semi-insulating GaAs substrate 301 by the MOCVD method like the first example.

And the Si-doped n-type $In0_{0.39}Al_{0.61}As$ electron supply layer 303, the non-doped $In_{0.39}Al_{0.61}As$ spacer layer 304, the non-doped $In_{0.40}Ga_{0.60}As$ channel layer 305, the non-doped $In_{0.39}Al_{0.61}As$ spacer layer 306, the Si-doped n-type $In_{0.39}Al_{0.61}As$ electron supply layer 307, the non-doped $In_{0.39}Al_{0.61}As$ Schottky contact layer 308, Si-doped n-type $In_{0.87}Ga_{0.13}P$ layer 309, and the Si-doped n-type $In_{0.4}Ga_{0.6}As$ ohmic contact layer 310 were formed on the non-doped $In_YAl_{1-Y}As$ buffer layer 302 in this order. The thickness of the non-doped $In_{0.39}Al_{0.61}As$ Schottky contact layer 308 was made to be 20 nm.

Then, the source electrode 311 and the drain electrode 312 by the Ti/Pt/Au non alloy type ohmic contact were formed like the first example. Then, the selective wet etching removal of the n-type InGaAs ohmic contact layer 310 was carried out with the phosphoric acid system etching solution. Furthermore, the selection wet etching removal of the n-type InGaAlP layer 309 was carried out with the chloride system etching solution. Then, the surface of the non-doped InAlAs Schottky contact layer 308 was exposed. And the Ti/Pt/Au gate electrode 313 was formed on it.

Thus, the electrical property of this MM-HEMT was compared with the MM-HEMT of the comparative example mentioned above about the first example. The result is that the both of the source resistance $R_s$ and the drain resistance Rd of MM-HEMT of the invention were reduced by about 20% compared with MM-HEMT of the comparative example. Both of the mutual conductance gm and the current gain cutoff frequency $f_T$ became higher by 10%, owing to the fall of $R_s$ and Rd. Moreover, the minimum noise figure $NF_{min}$ was reduced by about 0.1 dB.

THIRD EXAMPLE

Next, HEMT in which the InGaP layer which does not include aluminum was inserted as the third example of the invention was manufactured. In the example, the Schottky contact layer has a structure where a non-doped AlGaAs layer is laminated on a non-doped InAlAs layer.

Figure 5:
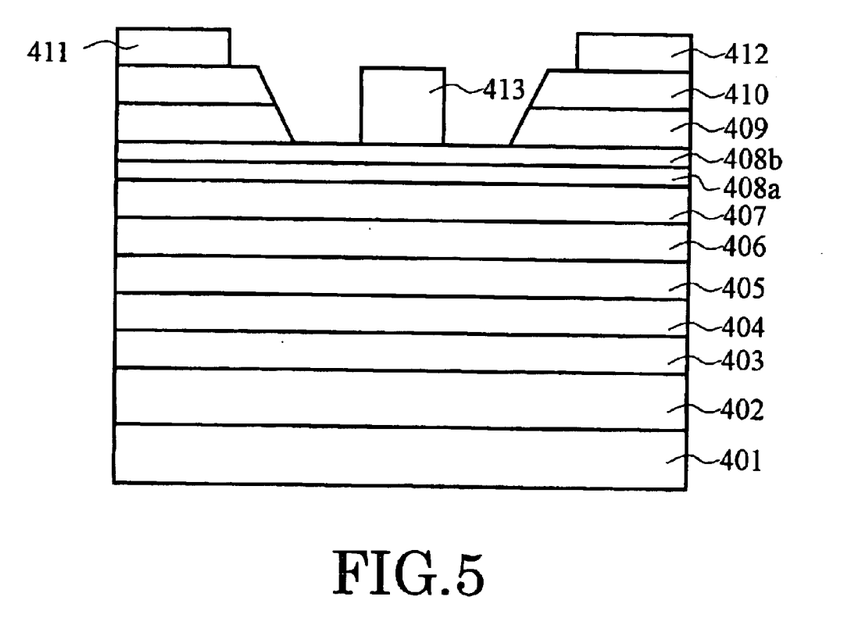
FIG. 5 is a schematic diagram showing the cross-sectional structure of MM-HEMT of the third example of the invention.

FIG. 5 is a schematic diagram showing the cross-sectional structure of MM-HEMT of this example. Hereafter, the structure of this HEMT will be explained along with the manufacturing process.

First, the non-doped $In_YAl_{1-Y}As$ buffer layer 402 whose indium composition was gradually changed from 0 to 0.3 was formed on the semi-insulating GaAs substrate 401 by the MOCVD method like the first example.

And the Si-doped n-type $In0_{0.3}Al_{0.7}As$ electron supply layer 403, the non-doped $In_{0.3}Al_{0.7}As$ spacer layer 404, the non-doped $In_{0.4}Ga_{0.6}As$ channel layer 405, the non-doped $In_{0.3}Al_{0.7}As$ spacer layer 406, the Si-doped n-type $In_{0.3}Al_{0.7}As$ electron supply layer 407, the non-doped $In_{0.3}Al_{0.7}As$ Schottky contact layer 408a, the non-doped $Al_{0.7}Ga_{0.3}As$ Schottky contact layer 408b, Si-doped n-type $In_{0.8}Ga_{0.2}P$ layer 7409, and the Si-doped n-type $In_{0.4}Ga_{0.6}As$ ohmic contact layer 410 were formed on the non-doped $In_YAl_{1-Y}As$ buffer layer 402 in this order.

The thickness of the non-doped $In_{0.3}Al_{0.7}As$ Schottky contact layer 408a was made to be 15 nm, and the thickness of the non-doped $Al_{0.7}Ga_{0.3}As$ Schottky contact layer 408b was made to be 5 nm. That is, the $Al_{0.7}Ga_{0.3}As$ Schottky contact layer 408b was made thinner since the $Al_{0.7}Ga_{0.3}As$ has a larger lattice mismatch.

Then, the source electrode 411 and the drain electrode 412 by the Ti/Pt/Au non alloy type ohmic contact were formed like the first example. Then, the selective wet etching removal of the n-type InGaAs ohmic contact layer 410 was carried out with the phosphoric acid system etching solution. Furthermore, the selection wet etching removal of the n-type InGaAlP layer 409 was carried out with the chloride system etching solution. Then, the surface of the non-doped InAlAs Schottky contact layer 408 was exposed. And the Ti/Pt/Au gate electrode 413 was formed on it.

Thus, the electrical property of this MM-HEMT was compared with the MM-HEMT of the comparative example mentioned above about the first example. The result is that the both of the source resistance $R_s$ and the drain resistance Rd of MM-HEMT of the invention were reduced by about 20% compared with MM-HEMT of the comparative example. Both of the mutual conductance gm and the current gain cutoff frequency $f_T$ became higher by 10%, owing to the fall of $R_s$ and Rd. Moreover, the minimum noise figure $NF_{min}$ was reduced by about 0.1 dB.

FOURTH EXAMPLE

Next, HEMT in which the InGaP layer which has a composition grading of indium was inserted as the fourth example of the invention was manufactured. In the example, the Schottky contact layer has a structure where a non-doped InGaP layer is inserted between a pair of non-doped InAlAs layers.

Figure 6:
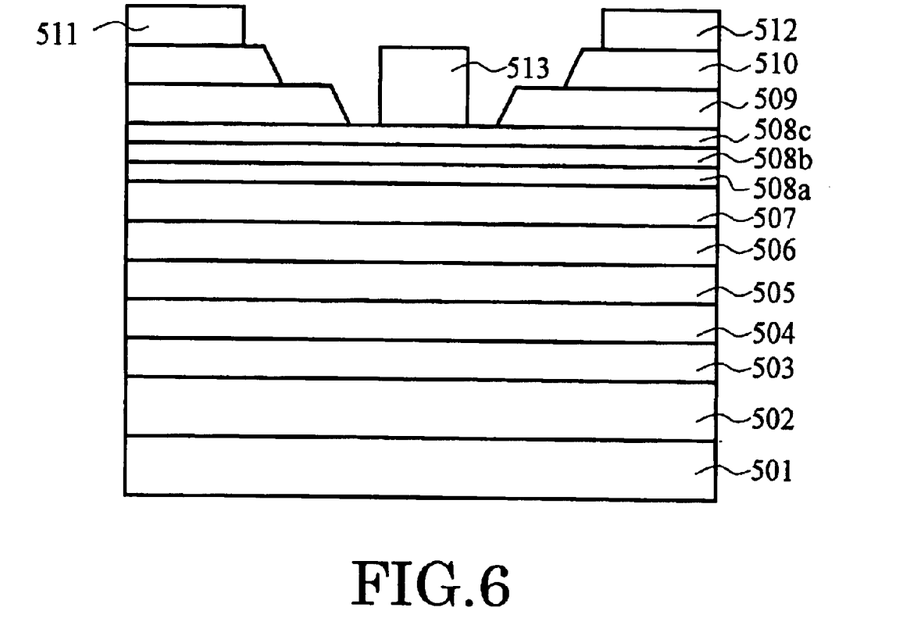
FIG. 6 is a schematic diagram showing the cross-sectional structure of MM-HEMT of the fourth example of the invention.

FIG. 6 is a schematic diagram showing the cross-sectional structure of MM-HEMT of this example. Hereafter, the structure of this HEMT will be explained along with the manufacturing process.

First, the non-doped $In_V Al_{1-V}As$ buffer layer 502 whose indium composition was gradually changed from 0 to 0.3 was formed on the semi-insulating GaAs substrate 501 by the MOCVD method like the first example.

And the Si-doped n-type $In_{0.3}Al_{0.7}As$ electron supply layer 503, the non-doped $In_{0.3}Al_{0.7}As$ spacer layer 504, the non-doped $In_{0.4}Ga_{0.6}As$ channel layer 505, the non-doped $In_{0.3}Al_{0.7}As$ spacer layer 506, the Si-doped n-type $In_{0.3}Al_{0.7}As$ electron supply layer 507, the non-doped $In_{0.3}Al_{0.7}As$ Schottky contact layer 508a, the non-doped $In_{0.8}Ga_{0.2}P$ Schottky contact layer 508b, the non-doped $In_{0.3}Al_{0.7}As$ Schottky contact layer 508c, Si-doped n-type $In_{0.8}Ga_{0.2}P$ layer 509, and the Si-doped n-type $In_{0.4}Ga_{0.6}As$ ohmic contact layer 510 were formed on the non-doped $In_V Al_{1-V}As$ buffer layer 502 in this order.

The thickness of the non-doped $In_{0.3}Al_{0.7}As$ Schottky contact layer 508a was made to be 5 nm, the thickness of the non-doped $In_{0.8}Ga_{0.2}P$ Schottky contact layer 508b was made to be 5 nm, and the thickness of the non-doped $In_{0.3}Al_{0.7}As$ Schottky contact layer 508c was made to be 10 nm.

Then, the source electrode 511 and the drain electrode 512 by the Ti/Pt/Au non-alloy type ohmic contact were formed like the first example. Then, the selective wet etching removal of the n-type InGaAs ohmic contact layer 510 was carried out with the phosphoric acid system etching solution. Furthermore, the selection wet etching removal of a part of the exposed portion of the n-type InGaAlP layer 509 was carried out with the chloride system etching solution. Then, the surface of the non-doped InAlAs Schottky contact layer 508 was exposed. And the Ti/Pt/Au gate electrode 513 was formed on it.

Thus, the electrical property of this MM-HEMT was compared with the MM-HEMT of the comparative example mentioned above about the first example. The result is that the both of the source resistance $R_s$ and the drain resistance Rd of MM-HEMT of the invention were reduced by about 20% compared with MM-HEMT of the comparative example. Both of the mutual conductance gm and the current gain cutoff frequency $f_T$ became higher by 10%, owing to the fall of $R_s$ and Rd. Moreover, the minimum noise figure $NF_{min}$ was reduced by about 0.1 dB.

Heretofore, the embodiments of the present invention have been explained, referring to the examples. However, the present invention is not limited to these specific examples.

For example, the structure of the semiconductor element and the semiconductor device the size, the form, the conduction-type, the concentration of impurities, and material of each element in each example, may be appropriately selected by those skilled in the art with the known techniques to carry out the invention as taught in the specification and obtain equivalent effects.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:

a GaAs substrate;

a buffer layer provided on the GaAs substrate, the buffer layer being made of a semiconductor, and at least a part of the semiconductor having a lattice constant larger than a lattice constant of GaAs;

a channel layer provided on the buffer layer, and being made of $In_{u1}Ga_{1-u1}As$;

an electron supply layer provided on or under the channel layer, and being made of n-type $In_{v1}Al_{1-v1}As$;

a Schottky contact layer provided on the channel layer and the electron supply layer, at least a part of the Schottky contact layer being made of non-doped $In_{v2}Al_{1-v2}As$;

a n-type $In_x(Ga_{1-y}Al_y)_{1-x}P$ layer provided on the Schottky contact layer;

a n-type $In_{u2}Ga_{1-u2}As$ ohmic contact layer provided on the n-type $In_x(Ga_{1-y}Al_y)_{1-x}P$ layer;

a gate electrode provided on the Schottky contact layer; and a source electrode and a drain electrode provided on the ohmic contact layer, wherein the Schottky contact layer has a non-doped InAlAs layer and an AlGaAs layer provided thereon.

2. A semiconductor device comprising:

a GaAs substrate;

a buffer layer provided on the GaAs substrate, the buffer layer being made of a semiconductor, and at least a part of the semiconductor having a lattice constant larger than a lattice constant of GaAs;

a channel layer provided on the buffer layer, and being made of $In_{u1}Ga_{1-u1}As$;

an electron supply layer provided on or under the channel layer, and being made of n-type $In_{v1}Al_{1-v1}As$;

a Schottky contact layer provided on the channel layer and the electron supply layer, at least a part of the Schottky contact layer being made of non-doped $In_{v2}Al_{1-v2}As$;

a n-type $In_x(Ga_{1-y}Al_y)_{1-x}P$ layer provided on the Schottky contact layer;

a n-type $In_{u2}Ga_{1-u2}As$ ohmic contact layer provided on the n-type $In_x(Ga_{1-y}Al_y)_{1-x}P$ layer;

a gate electrode provided on the Schottky contact layer; and a source electrode and a drain electrode provided on the ohmic contact layer, wherein the Schottky contact layer has a first non-doped InAlAs layer, an InGaP layer provided on the first non-doped InAlAs layer and a second non-doped InAlAs layer provided on the InGaP layer.

3. The semiconductor device according to claim 1, wherein:

the indium composition x of the $In_x(Ga_{1-y}Al_y)_{1-x}P$ layer has a distribution which shows a gradual or a stepwise increase from the Schottky contact layer toward the ohmic contact layer.

4. The semiconductor device according to claim 1, wherein:

the indium composition x of the $In_x(Ga_{1-y}Al_y)_{1-x}P$ layer has a distribution which shows a gradual or a stepwise decrease from the Schottky contact layer toward the ohmic contact layer.

5. A semiconductor device comprising:

a GaAs substrate;

a buffer layer provided on the GaAs substrate, the buffer layer being made of a semiconductor, and at least a part of the semiconductor having a lattice constant larger than a lattice constant of GaAs;

a laminated structure provided on the buffer layer, including a channel layer and a electron supply layer, the channel layer being made of $In_{u1}Ga_{1-u}As$, and the electron supply layer being made of n-type $In_{v1}Al_{1-v1}As$;

a Schottky contact layer provided on the laminated structure, at least a part of the Schottky contact layer being made of non-doped $In_{v2}Al_{1-v2}As$;

a n-type $In_x(Ga_{1-y}Al_y)_{1-x}P$ layer provided on the Schottky contact layer;

a n-type $In_{u2}Ga_{1-u2}As$ ohmic contact layer provided on the n-type $In_x(Ga_{1-y}Al_y)_{1-x}P$ layer;

a gate electrode provided on the Schottky contact layer; and a source electrode and a drain electrode provided on the ohmic contact layer, the $In_x(Ga_{1-y}Al_y)_{1-x}P$ layer having a part where a bandgap has a distribution which shows a gradual or a stepwise decrease from the Schottky contact layer toward the ohmic contact layer.

6. The semiconductor device according to claim 5, wherein:

the buffer layer consists of a single layer or a plurality of laminated layers made of at least one material selected from a group consisting of InAlAs, InGaAs, InGaAlAs, InGaP, InAlP and InGaAlP, and the buffer layer has a part where a lattice constant inherent to the material has a distribution which shows a gradual or a stepwise increase as a distance from the substrate becomes larger along a thickness direction.

7. A semiconductor device comprising:

a GaAs substrate;

a buffer layer provided on the GaAs substrate, the buffer layer being made of a semiconductor, and at least a part of the semiconductor having a lattice constant larger than a lattice constant of GaAs;

a laminated structure provided on the buffer layer, including a channel layer and a electron supply layer, the channel layer being made of $In_{u1}Ga_{1-u1}As$, and the electron supply layer being made of n-type $In_{v1}Al_{1-v1}As$;

a Schottky contact layer provided on the laminated structure, at least a part of the Schottky contact layer being made of non-doped $In_{v2}Al_{1-v2}As$;

a n-type $In_x(Ga_{1-y}Al_y)_{1-x}P$ layer provided on the Schottky contact layer;

a n-type $In_{u2}Ga_{1-u2}As$ ohmic contact layer provided on the n-type $In_x(Ga_{1-y}Al_y)_{1-x}P$ layer;

a gate electrode provided on the Schottky contact layer; and a source electrode and a drain electrode provided on the ohmic contact layer, the buffer layer having a part where the lattice constant has a distribution which shows a gradual or a stepwise increase from the substrate toward the laminated structure, and the $In_x(Ga_{1-y}Al_y)_{1-x}P$ layer having a part where a bandgap has a distribution which shows a gradual or a stepwise decrease from the Schottky contact layer toward the ohmic contact layer.

8. The semiconductor device according to claim 7, wherein:

the indium composition u1 of the channel layer is $0.31 \leq u1 \leq 0.45$, and the indium composition u2 of the ohmic contact layer is $0.31 \leq u1 \leq 0.60$.

9. The semiconductor device according to claim 7, wherein:

the indium composition u2 of the ohmic contact layer is $0.45 \leq u2 \leq 0.60$, and a thickness of the ohmic contact layer is not larger than 20 nm.

10. The semiconductor device according to claim 7, wherein:

the indium composition v1 of the electron supply layer is $0.1 \leq v1 \leq 0.44$, and the indium composition v2 of the $In_{v2}Al_{1-v2}As$ of the Schottky contact layer is $0.30 \leq v1 \leq 0.44$.

11. The semiconductor device according to claim 7, wherein:

the indium composition v1 of the electron supply layer is $0.1 \leq v1 \leq 0.3$, and a thickness of the electron supply layer is not larger than 15 nm.

* * * * *